(12) United States Patent
Zhang

(10) Patent No.: US 10,816,835 B2
(45) Date of Patent: Oct. 27, 2020

(54) DISPLAY DRIVING CHIP AND LIQUID CRYSTAL DISPLAY DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Xianming Zhang, Guangdong (CN)

(73) Assignee: SHENZHEN CHINA STAR OPTOELECTRONICS SEMICONDUCTOR DISPLAY TECHNOLOGY CO., LTD, Shenzhen, Guangdong (CN)

( * ) Notice: Subject to any disclaimer, the term of this patent is extended or adjusted under 35 U.S.C. 154(b) by 0 days.

(21) Appl. No.: 16/615,405

(22) PCT Filed: Dec. 4, 2017

(86) PCT No.: PCT/CN2017/114384
§ 371 (c)(1),
(2) Date: Nov. 21, 2019

(87) PCT Pub. No.: WO2019/015213
PCT Pub. Date: Jan. 24, 2019

(65) Prior Publication Data
US 2020/0183210 A1 Jun. 11, 2020

(30) Foreign Application Priority Data
Jul. 19, 2017 (CN) .......................... 2017 1 0591448

(51) Int. Cl.
*G02F 1/133* (2006.01)
*G09G 3/36* (2006.01)
*H03K 19/20* (2006.01)

(52) U.S. Cl.
CPC ....... *G02F 1/13306* (2013.01); *G09G 3/3611* (2013.01); *G09G 2310/0243* (2013.01);
(Continued)

(58) Field of Classification Search
CPC .............. G02F 1/13306; G09G 3/3611; G09G 2310/0243; G09G 2330/026; G09G 2330/027; H03K 19/20
See application file for complete search history.

(56) References Cited

U.S. PATENT DOCUMENTS 7,081,722 B1 * 7/2006 Huynh ................... H05B 45/48
315/323
7,187,226 B2 * 3/2007 Audy ...................... H02M 1/38
326/27

(Continued)

*Primary Examiner* — Ariel A Balaoing
(74) *Attorney, Agent, or Firm* — Soroker Agmon Nordman

(57) ABSTRACT

A display driving chip and a liquid crystal display device are provided. The display driving chip including chip body and an enable signal generation module. The chip body is configured to provide a power supplying voltage to a power supplying end of a first comparator and to output a driving signal when an enable signal is at a high electrical level and an input voltage is greater than a predetermined under-voltage lock out (UVLO) voltage, and configured to stop from providing the power supplying voltage to the power supplying end of the first comparator and from outputting the driving signal when the enable signal is at a low electrical level or when the enable signal is at the high electrical level and the input voltage is less than or equal to the predetermined UVLO voltage.

11 Claims, 1 Drawing Sheet

(52) U.S. Cl.
CPC . *G09G 2330/026* (2013.01); *G09G 2330/027* (2013.01); *H03K 19/20* (2013.01)

(56) References Cited

U.S. PATENT DOCUMENTS

| | | | | |
|---|---|---|---|---|
| 9,198,254 | B2* | 11/2015 | Zhang | G09G 3/3406 |
| 2003/0098678 | A1* | 5/2003 | Haraguchi | H02M 1/36 |
| | | | | 323/282 |
| 2005/0174818 | A1* | 8/2005 | Lin | H05B 41/2828 |
| | | | | 363/98 |
| 2007/0222721 | A1* | 9/2007 | Yagi | G09G 3/3406 |
| | | | | 345/82 |
| 2015/0145424 | A1* | 5/2015 | Zhang | G09G 3/3406 |
| | | | | 315/185 R |
| 2017/0004800 | A1* | 1/2017 | Park | G09G 3/3648 |
| 2017/0169788 | A1* | 6/2017 | Kim | G09G 3/3696 |
| 2019/0267793 | A1* | 8/2019 | Hematy | H02H 7/1222 |

* cited by examiner

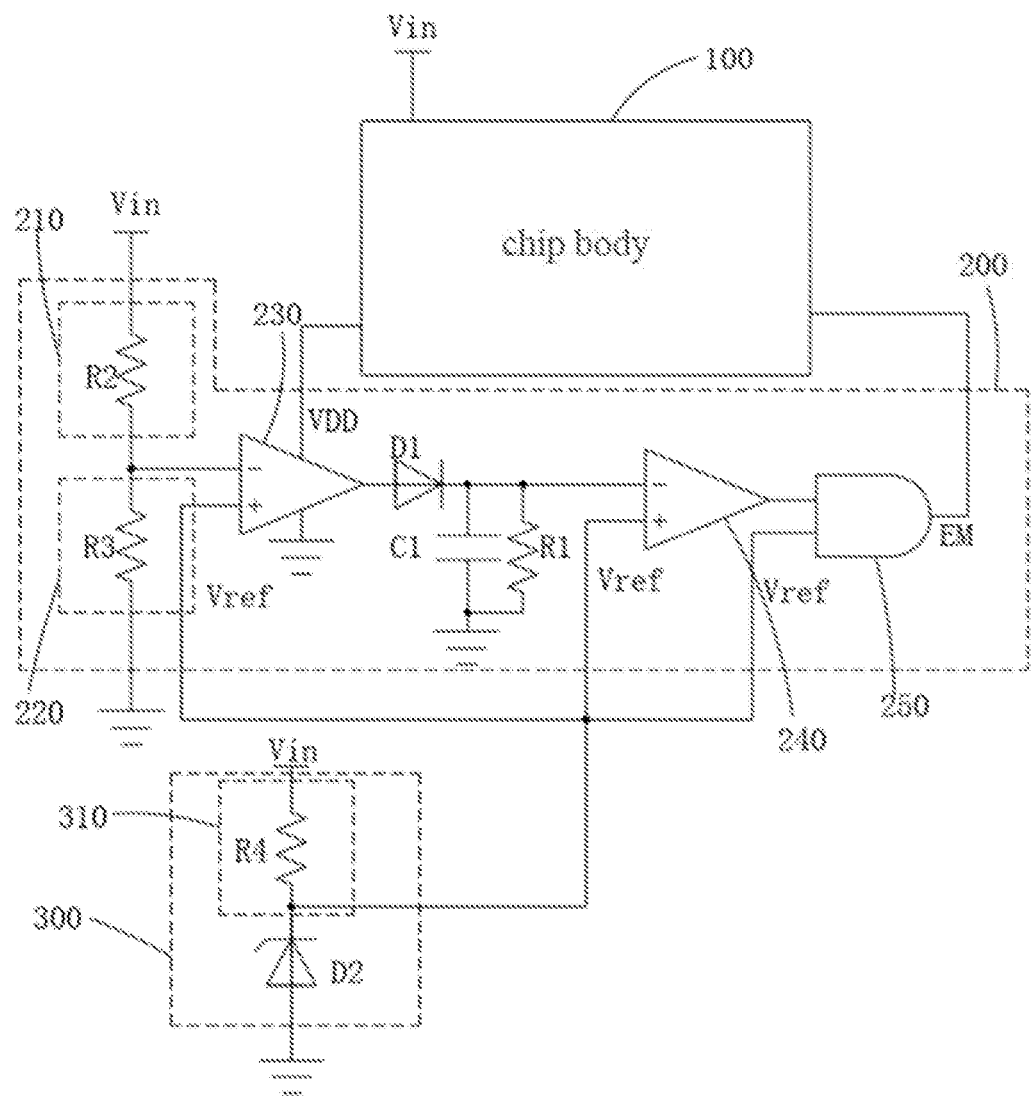

DISPLAY DRIVING CHIP AND LIQUID CRYSTAL DISPLAY DEVICE

FIELD

The present disclosure relates to display technologies, and more particularly, to a display driving chip and a liquid crystal display device.

BACKGROUND

Liquid crystal display (LCD) has many advantages such as thin body, power saving, no radiation, etc., has been widely used, such as: LCD TV, mobile phone, personal digital assistant (PDA), digital camera, computer screen or laptop computer screens, etc., and dominates a field of flat panel display.

Most of liquid crystal display devices on market are backlight type liquid crystal display devices, which include a liquid crystal display panel and a backlight module. A working principle of the liquid crystal display panel is to fill liquid crystal molecules between a thin film transistor array substrate (TFT Array Substrate) and a color filter (CF) substrate, and apply driving voltage on the two substrates to control directions of rotation of the liquid crystal molecules to refract light of the backlight module to produce an image.

The existing liquid crystal display devices have a lot of kinds of display driving chips (ICs) for providing various driving signals for the liquid crystal display devices. Each display driving chip needs an input voltage when working. When the input voltage of the display driving chip is higher than a preset voltage of under voltage lock out (UVLO) of the display driver chip, the display driver chip starts to output a drive signal. In the use of TFT-LCD, it is often encountered an operation of quick switching a mechanical switch to make the TFT-LCD quick turning on and off. A time between shutdown and the next power-on can less than 300 ms. Such a quick switching operation of the liquid crystal display device leads display driving chips cannot be reset, and a large amount of charge in the liquid crystal display device cannot be released. Circuit lines in the liquid crystal display device cannot be restored to an initial state, if again a power-on operation is performed in this case, a large current is generated inside the liquid crystal display device, which affects the normal operation of the display driving chip. In severe cases, the display driving chip or the liquid crystal display device may be broken or damaged. Therefore, there is a need to solve the above issues.

SUMMARY

In view of the above, the present disclosure provides a display driving chip to delay a start of the display driving chip to ensure a normal operation of the display driving chip and the liquid crystal display device when the display device is quick switching on and off.

In view of the above, the present disclosure provides a liquid crystal display device to delay a start of the display driving chip to ensure a normal operation of the display driving chip and the liquid crystal display device when the display device is quick switching on and off.

In order to achieve above-mentioned object of the present disclosure, one embodiment of the disclosure provides a display driving chip including a chip body, and an enable signal generating module electrically connected to the chip body.

The enable signal generating module includes a first voltage-dividing unit, a second voltage-dividing unit, a first comparator, a first diode, a capacitor, a first resistor, a second comparator, and an AND gate. A first end of the first voltage-dividing unit is received an input voltage. A second end of the first voltage-dividing unit is electrically connected to a first end of the second voltage-dividing unit. A second end of the second voltage-dividing unit is connected to ground. An inverting input end of the first comparator is electrically connected to the second end of the first voltage-dividing unit. A non-inverting input end of the first comparator is received a reference voltage. An output end of the first comparator is electrically connected to an anode of the first diode. A power supplying end of the first comparator is electrically connected to a power output end of the chip body. A ground end of the first comparator is connected to ground. A cathode of the first diode is electrically connected to a first end of the capacitor. A second end of the capacitor is connected to ground. A first end of the first resistor and a second end of the first resistor is respectively electrically connected to the first end of the capacitor and the second end of the capacitor. An inverting input end of the second comparator is electrically connected to the first end of the capacitor. A non-inverting input end of the second comparator is received the reference voltage. An output end of the second comparator is electrically connected to a first input end of the AND gate. A second input end of the AND gate is received the reference voltage. An output end of the AND gate is electrically connected to a control end of the chip body to output an enable signal thereto.

An input end of the chip body is received the input voltage. The chip body is configured to provide a power supplying voltage to the power supplying end of the first comparator and to output a driving signal when the enable signal is at a high electrical level and the input voltage is greater than a predetermined under-voltage lock out (UVLO) voltage, and configured to stop front providing the power supplying voltage to the power supplying end of the first comparator and from outputting the driving signal when the enable signal is at a low electrical level or when the enable signal is at the high electrical level and the input voltage is less than or equal to the predetermined UVLO voltage.

In one embodiment of the disclosure, the display driving chip further includes a reference voltage outputting module electrically connected to the enable signal generating module.

The reference voltage outputting module includes a third voltage-dividing unit and a Zener diode. A first end of the third voltage-dividing unit is received the input voltage. A second end of the third voltage-dividing unit is electrically connected to a cathode of the Zener diode. An anode of the Zener diode is connected to ground.

The second end of the third voltage-dividing unit is electrically connected to the non-inverting input end of the first comparator, the non-inverting input end of the second comparator, and the second input end of the AND gate to output the reference voltage to the non-inverting input end of the first comparator, the non-inverting input end of the second comparator, and the second input end of the AND gate.

In one embodiment of the disclosure, a regulated voltage of the Zener diode is greater than a first voltage, and the first voltage is a voltage at the second end of the first voltage-dividing unit when the input voltage is the predetermined UVLO voltage.

In one embodiment of the disclosure, a regulated voltage of the Zener diode is less than a second voltage, and the second voltage is a voltage at the second end of the first voltage-dividing unit when the input voltage is a rated operating voltage of the chip body.

In one embodiment of the disclosure, the rated operating voltage is 12±1.2V.

In one embodiment of the disclosure, the power supplying voltage is 3.3±0.1V.

In one embodiment of the disclosure, the first voltage-dividing unit is a second resistor, the second voltage-dividing unit is a third resistor, and the third voltage-dividing unit is a fourth resistor.

Furthermore, another embodiment of the disclosure provides a liquid crystal display device including the display driving chip abovementioned.

Furthermore, another embodiment of the disclosure provides a display driving chip including a chip body, and an enable signal generating module electrically connected to the chip body.

The enable signal generating module includes a first voltage-dividing unit, a second voltage-dividing unit, a first comparator, a first diode, a capacitor, a first resistor, a second comparator, and an AND gate. A first end of the first voltage-dividing unit is received an input voltage. A second end of the first voltage-dividing unit is electrically connected to a first end of the second voltage-dividing unit. A second end of the second voltage-dividing unit is connected to ground. An inverting input end of the first comparator is electrically connected to the second end of the first voltage-dividing unit. A non-inverting input end of the first comparator is received a reference voltage. An output end of the first comparator is electrically connected to an anode of the first diode. A power supplying end of the first comparator is electrically connected to a power output end of the chip body. A ground end of the first comparator is connected to ground. A cathode of the first diode is electrically connected to a first end of the capacitor. A second end of the capacitor is connected to ground. A first end of the first resistor and a second end of the first resistor is respectively electrically connected to the first end of the capacitor and the second end of the capacitor. An inverting input end of the second comparator is electrically connected to the first end of the capacitor. A non-inverting input end of the second comparator is received the reference voltage. An output end of the second comparator is electrically connected to a first input end of the AND gate. A second input end of the AND gate is received the reference voltage. An output end of the AND gate is electrically connected to a control end of the chip body to output an enable signal thereto.

An input end of the chip body is received the input voltage. The chip body is configured to provide a power supplying voltage to the power supplying end of the first comparator and to output a driving signal when the enable signal is at a high electrical level and the input voltage is greater than a predetermined UVLO voltage, and configured to stop from providing the power supplying voltage to the power supplying end of the first comparator and from outputting the driving signal when the enable signal is at a low electrical level or when the enable signal is at the high electrical level and the input voltage is less than or equal to the predetermined UVLO voltage.

The display driving chip further includes a reference voltage outputting module electrically connected to the enable signal generating module.

The reference voltage outputting module includes a third voltage-dividing unit and a Zener diode. A first end of the third voltage-dividing unit is received the input voltage. A second end of the third voltage-dividing unit is electrically connected to a cathode of the Zener diode. An anode of the Zener diode is connected to ground.

The second end of the third voltage-dividing unit is electrically connected to the non-inverting input end of the first comparator, the non-inverting input end of the second comparator, and the second input end of the AND gate to output the reference voltage to the non-inverting input end of the first comparator, the non-inverting input end of the second comparator, and the second input end of the AND gate.

A regulated voltage of the Zener diode is greater than a first voltage, and the first voltage is a voltage at the second end of the first voltage-dividing unit when the input voltage is the predetermined UVLO voltage;

The regulated voltage of the Zener diode is less than a second voltage, and the second voltage is a voltage at the second end of the first voltage-dividing unit when the input voltage is a rated operating voltage of the chip body; and The first voltage-dividing unit is a second resistor, the second voltage-dividing unit is a third resistor, and the third voltage-dividing unit is a fourth resistor.

In comparison with prior art, the display driving chip of the disclosure provides the chip body and the enable signal generating module to delay a start of the display driving chip to ensure a normal operation of the display driving chip and the liquid crystal display device when the display device is quick switching on and off. When the display device is quick switching on and off, the input voltage is dropped from the rated operating voltage of the chip body. When a voltage of the second end of the first voltage-dividing unit is less than the reference voltage, the first comparator will output high electrical level to charge the capacitor until a voltage of the first end of the capacitor is greater than the reference voltage. The second comparator outputs low electrical level to change the enable signal of the AND gate to a low electrical level and to control the chip body stop front outputting the driving signal and stop from providing the power supplying voltage to the first comparator. The capacitor and the first resistor from a discharge circuit. After a period of time, the voltage at the first end of the capacitor is lower than the reference voltage. The AND gate outputs high electrical level enable signal to the chip body. The present disclosure provides a liquid crystal display device including the abovementioned display driving chip to delay a start of the display driving chip to ensure a normal operation of the display driving chip and the liquid crystal display device when the display device is quick, switching on and off.

BRIEF DESCRIPTION OF DRAWINGS

FIG. 1 is a schematic view of a circuit of a display driving chip according to an embodiment of the present disclosure.

DETAILED DESCRIPTION

The following description of the embodiments is provided by reference to the drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Referring to FIG. 1, one embodiment of the disclosure provides a display driving chip including a chip body 100, an enable signal generating module 200 electrically connected to the chip body 100, and a reference voltage outputting module 300 electrically connected to the enable signal generating module 200.

The enable signal generating module 200 includes a first voltage-dividing unit 210, a second voltage-dividing unit 220, a first comparator 230, a first diode D1, a capacitor C1, a first resistor R1, a second comparator 240, and an AND gate 250. A first end of the first voltage-dividing unit 210 is received an input voltage Vin. A second end of the first voltage-dividing unit 210 is electrically connected to a first end of the second voltage-dividing unit 220. A second end of the second voltage-dividing unit 220 is connected to ground. An inverting input end of the first comparator 230 is electrically connected to the second end of the first voltage-dividing unit 210. A non-inverting input end of the first comparator 230 is received a reference voltage Vref. An output end of the first comparator 230 is electrically connected to an anode of the first diode D1. A power supplying end of the first comparator 230 is electrically connected to a power output end of the chip body 100. A ground end of the first comparator 230 is connected to ground. A cathode of the first diode D1 is electrically connected to a first end of the capacitor C1. A second end of the capacitor C1 is connected to ground. A first end of the first resistor R1 and a second end of the first resistor R1 is respectively electrically connected to the first end of the capacitor C1 and the second end of the capacitor C1. An inverting input end of the second comparator 240 is electrically connected to the first end of the capacitor C1. A non-inverting input end of the second comparator 240 is received the reference voltage Vref. An output end of the second comparator 240 is electrically connected to a first input end of the AND gate 250. A second input end of the AND gate 250 is received the reference voltage Vref. An output end of the AND gate 250 is electrically connected to a control end of the chip body 100 to output an enable signal EM thereto.

The reference voltage outputting module 300 includes a third voltage-dividing unit 310 and a Zener diode D2. A first end of the third voltage-dividing unit 310 is received the input voltage Vin. A second end of the third voltage-dividing unit 310 is electrically connected to a cathode of the Zener diode D2. An anode of the Zener diode D2 is connected to ground.

The second end of the third voltage-dividing unit 310 is electrically connected to the non-inverting input end of the first comparator 230, the non-inverting input end of the second comparator 240, and the second input end of the AND gate 250 to output the reference voltage Vref to the non-inverting input end of the first comparator 230, the non-inverting input end of the second comparator 240, and the second input end of the AND gate 250.

An input end of the chip body 100 is received the input voltage Vin. The chip body 100 is configured to provide a power supplying voltage VDD to the power supplying end of the first comparator 230 and to output a driving signal when the enable signal EM is at a high electrical level and the input voltage Vin is greater than a predetermined under-voltage lock out (UVLO) voltage, and configured to stop from providing the power supplying voltage VDD to the power supplying end of the first comparator 230 and from outputting the driving signal when the enable signal EM is at a low electrical level or when the enable signal EM is at the high electrical level and the input voltage Vin is less than or equal to the predetermined UVLO voltage.

In one embodiment of the disclosure, a regulated voltage of the Zener diode D2 is greater than a first voltage, and the first voltage is a voltage at the second end of the first voltage-dividing unit 210 when the input voltage Vin is the predetermined UVLO voltage. In one embodiment of the disclosure, a regulated voltage of the Zener diode D2 is less than a second voltage, and the second voltage is a voltage at the second end of the first voltage-dividing unit 210 when the input voltage Vin is a rated operating voltage of the chip body 100.

The rated operating voltage of the chip body 100 is an input voltage Vin providing to an input end of the chip body 100 at normal operation.

In one embodiment of the disclosure, the rated operating voltage is 12±1.2V.

In one embodiment of the disclosure, the power supplying voltage VDD is 3.3±0.1V.

In one embodiment of the disclosure, the first voltage-dividing unit 210 is a second resistor R2, the second voltage-dividing unit 220 is a third resistor R3, and the third voltage-dividing unit 230 is a fourth resistor R4.

The principle of operation of the display driving chip is as follow:

In normal operation, an input voltage Vin provided to the chip body 100 and the first end of the first voltage-dividing unit 210 is the rated operating voltage of the chip body 100. A voltage of the second end of the first voltage-dividing unit 210 is greater than the regulated voltage of the Zener diode D2, which is the reference voltage Vref providing to the non-inverting input end of the first comparator 230. The output end of the first comparator 230 provides the low electrical level to the inverting input end of the second comparator 240. The output end of the second comparator 240 provides the high electrical level to the first input end of the AND gate 250. The AND gate 250 provides the high level enable signal EM to insure a normal operation of the chip body 100. In an operation of quick switching on and off, the input voltage Vin provided to the chip body 100 and the first end of the first voltage-dividing unit 210 decreases from the rated operating voltage of the chip body 100. When the voltage of the second end of the first voltage-dividing unit 210 is less than the regulated voltage of the Zener diode D2, which is the reference voltage Vref providing to the non-inverting input end of the first comparator 230, the output end of the first comparator 230 provides the high electrical level to charge the capacitor C1 until a voltage of the first end of the capacitor C1 greater than the regulated voltage of the Zener diode D2, which is the reference voltage Vref providing to the non-inverting input end of the second comparator 240. The output end of the second comparator 240 provides the low electrical level to the first input end of the AND gate 250. The AND gate 250 provides the low level enable signal EM to the chip body 100. The chip body 100 stop from providing the driving signal, and stop from providing power supplying voltage VDD to the power supplying end of the first comparator 230. The first comparator 230 doesn't work. The capacitor C1 and the first resistor R1 form an RC circuit to discharge the first end of the capacitor C1. According the discharging equation of RC circuit, one can control a period when the voltage of the first end of the capacitor C1 decreases to a value less than the reference voltage Vref by adjusting a resistance of the first resistor R1 and a capacitance of the capacitor C1. After a period (3 seconds for example), the voltage of the first end of the capacitor C1 is less than the reference voltage Vref.

The voltage of the output end of the second comparator 240 changes from tire low electrical to tire high electrical level. The enable signal EM outputted from the AND gate changes from low level to high level and is provided to the chip body 100. When the input voltage Vin changes to be greater than the UVLO voltage again, the chip body 100 starts to provide the driving signal. In comparison with prior art, the chip body 100 starts after a delay period from a time the voltage of the first end of the capacitor C1 is greater than the reference voltage to a time the voltage of the first end of the capacitor C1 is discharged to less than the reference voltage. The display driving chip has enough time to reset to ensure a normal operation of the display driving chip when the display device is quick-switching on and off.

At a normal starting up operation, although the input voltage Vin is smaller at starting, the starting up of the display driving chip will not be delay because the chip body 100 will not provide the power supplying voltage VDD to the power supplying end of the first comparator 230 and the output end of the first comparator 230 will not charge the capacitor C1. At a normal shutting down operator, the input voltage Vin decreases to 0 finally. The voltage of the first end of the capacitor C1 gradually decreases to 0. There has no reference voltage Vref when the input voltage Vin is 0. There have no voltages at the second comparator 240 and the AND gate 250. The display driving chip will not be abnormal.

The present disclosure further provides a liquid crystal display device including the abovementioned display driving chip to delay a start of the display driving chip to ensure a normal operation of the display driving chip and the liquid crystal display device when the display device is quick switching on and off.

In comparison with prior art, the display driving chip of the disclosure provides the chip body and the enable signal generating module to delay a start of the display driving chip to ensure a normal operation of the display driving chip and the liquid crystal display device when the display device is quick switching on and off. When the display device is quick switching on and off, the input voltage is dropped from the rated operating voltage of the chip body. When a voltage of the second end of the first voltage-dividing unit is less than the reference voltage, the first comparator will output high electrical level to charge the capacitor until a voltage of the first end of the capacitor is greater than the reference voltage. The second comparator outputs low electrical level to change the enable signal of the AND gate to a low electrical level and to control the chip body stop from outputting the driving signal and stop from providing the power supplying voltage to the first comparator. The capacitor and the first resistor from a discharge circuit. After a period of time, the voltage at the first end of the capacitor is lower than the reference voltage. The AND gate outputs high electrical level enable signal to the chip body. The present disclosure provides a liquid crystal display device including the abovementioned display driving chip to delay a start of the display driving chip to ensure a normal operation of the display driving chip and the liquid crystal display device when the display device is quick switching on and off.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A display driving chip, comprising a chip body, and an enable signal generating module electrically connected to the chip body;
   wherein the enable signal generating module comprises a first voltage-dividing unit, a second voltage-dividing unit, a first comparator, a first diode, a capacitor, a first resistor, a second comparator, and an AND gate, a first end of the first voltage-dividing unit is received an input voltage, a second end of the first voltage-dividing unit is electrically connected to a first end of the second voltage-dividing unit, a second end of the second voltage-dividing unit is connected to ground, an inverting input end of the first comparator is electrically connected to the second end of the first voltage-dividing unit, a non-inverting input end of the first comparator is received a reference voltage, an output end of the first comparator is electrically connected to an anode of the first diode, a power supplying end of the first comparator is electrically connected to a power output end of the chip body, a ground end of the first comparator is connected to ground, a cathode of the first diode is electrically connected to a first end of the capacitor, a second end of the capacitor is connected to ground, a first end of the first resistor and a second end of the first resistor is respectively electrically connected to the first end of the capacitor and the second end of the capacitor, an inverting input end of the second comparator is electrically connected to the first end of the capacitor, a non-inverting input end of the second comparator is received the reference voltage, an output end of the second comparator is electrically connected to a first input end of the AND gate, a second input end of the AND gate is received the reference voltage, and an output end of the AND gate is electrically connected to a control end of the chip body to output an enable signal thereto; and
   wherein an input end of the chip body is received the input voltage, the chip body is configured to provide a power supplying voltage to the power supplying end of the first comparator and to output a driving signal when the enable signal is at a high electrical level and the input voltage is greater than a predetermined under-voltage lock out (UVLO) voltage, and configured to stop from providing the power supplying voltage to the power supplying end of the first comparator and from outputting the driving signal when the enable signal is at a low electrical level or when the enable signal is at the high electrical level and the input voltage is less than or equal to the predetermined UVLO voltage.

2. The display driving chip according to claim 1, further comprising a reference voltage outputting module electrically connected to the enable signal generating module;
   wherein the reference voltage outputting module comprises a third voltage-dividing unit and a Zener diode, a first end of the third voltage-dividing unit is received the input voltage, a second end of the third voltage-dividing unit is electrically connected to a cathode of the Zener diode, and an anode of the Zener diode is connected to ground; and
   wherein the second end of the third voltage-dividing unit is electrically connected to the non-inverting input end of the first comparator, the non-inverting input end of the second comparator, and the second input end of tire AND gate to output the reference voltage to the non-inverting input end of the first comparator, the non-inverting input end of the second comparator, and the second input end of the AND gate.

3. The display driving chip according to claim 2, wherein a regulated voltage of the Zener diode is greater than a first voltage, and the first voltage is a voltage at the second end of the first voltage-dividing unit when the input voltage is the predetermined UVLO voltage.

4. The display driving chip according to claim 2, wherein a regulated voltage of the Zener diode is less than a second voltage, and the second voltage is a voltage at the second end of the first voltage-dividing unit when the input voltage is a rated operating voltage of the chip body.

5. The display driving chip according to claim 4, wherein the rated operating voltage is 12±1.2V.

6. The display driving chip according to claim 1, wherein the power supplying voltage is 3.3±0.1V.

7. The display driving chip according to claim 2, wherein the first voltage-dividing unit is a second resistor, the second voltage-dividing unit is a third resistor, and the third voltage-dividing unit is a fourth resistor.

8. A liquid crystal display device, comprising the display driving chip according to claim 1.

9. A display driving chip, comprising a chip body, and an enable signal generating module electrically connected to the chip body;
wherein the enable signal generating module comprises a first voltage-dividing unit, a second voltage-dividing unit, a first comparator, a first diode, a capacitor, a first resistor, a second comparator, and an AND gate, a first end of the first voltage-dividing unit is received an input voltage, a second end of the first voltage-dividing unit is electrically connected to a first end of the second voltage-dividing unit, a second end of the second voltage-dividing unit is connected to ground, an inverting input end of the first comparator is electrically connected to the second end of the first voltage-dividing unit, a non-inverting input end of the first comparator is received a reference voltage, an output end of the first comparator is electrically connected to an anode of the first diode, a power supplying end of the first comparator is electrically connected to a power output end of the chip body, a ground end of the first comparator is connected to ground, a cathode of the first diode is electrically connected to a first end of the capacitor, a second end of the capacitor is connected to ground, a first end of the first resistor and a second end of the first resistor is respectively electrically connected to the first end of the capacitor and the second end of the capacitor, an inverting input end of the second comparator is electrically connected to the first end of the capacitor, a non-inverting input end of the second comparator is received the reference voltage, an output end of the second comparator is electrically connected to a first input end of the AND gate, a second input end of the AND gate is received the reference voltage, and an output end of the AND gate is electrically connected to a control end of the chip body to output an enable signal thereto;
wherein an input end of the chip body is received the input voltage, the chip body is configured to provide a power supplying voltage to the power supplying end of the first comparator and to output a driving signal when the enable signal is at a high electrical level and the input voltage is greater than a predetermined under-voltage lock out (UVLO) voltage, and configured to stop from providing the power supplying voltage to the power supplying end of the first comparator and from outputting the driving signal when the enable signal is at a low electrical level or when the enable signal is at the high electrical level and the input voltage is less than or equal to the predetermined UVLO voltage;
wherein the display driving chip further comprises a reference voltage outputting module electrically connected to the enable signal generating module;
wherein the reference voltage outputting module comprises a third voltage-dividing unit and a Zener diode, a first end of the third voltage-dividing unit is received the input voltage, a second end of the third voltage-dividing unit is electrically connected to a cathode of the Zener diode, and an anode of the Zener diode is connected to ground;
wherein the second end of the third voltage-dividing unit is electrically connected to the non-inverting input end of the first comparator, the non-inverting input end of the second comparator, and the second input end of the AND gate to output the reference voltage to the non-inverting input end of the first comparator, the non-inverting input end of the second comparator, and the second input end of tire AND gate;
wherein a regulated voltage of the Zener diode is greater than a first voltage, and the first voltage is a voltage at the second end of the first voltage-dividing unit when the input voltage is the predetermined UVLO voltage;
wherein the regulated voltage of the Zener diode is less than a second voltage, and the second voltage is a voltage at the second end of the first voltage-dividing unit when the input voltage is a rated operating voltage of the chip body; and
wherein the first voltage-dividing unit is a second resistor, the second voltage-dividing unit is a third resistor, and the third voltage-dividing unit is a fourth resistor.

10. The display driving chip according to claim 9, wherein the rated operating voltage is 12±1.2V.

11. The display driving chip according to claim 9, wherein the power supplying voltage is 3.3±0.1V.

* * * * *